United States Patent
Lin et al.

(10) Patent No.: US 9,747,409 B2
(45) Date of Patent: Aug. 29, 2017

(54) METHOD OF PARAMETER EXTRACTION AND SYSTEM THEREOF

(71) Applicant: TAIWAN SEMICONDUCTOR MANUFACTURING COMPANY LTD., Hsinchu (TW)

(72) Inventors: Wei-Yang Lin, Yunlin County (TW); Kai-Ming Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/863,900

(22) Filed: Sep. 24, 2015

(65) Prior Publication Data

US 2017/0091371 A1   Mar. 30, 2017

(51) Int. Cl.
*G06F 9/45* (2006.01)
*G06F 17/50* (2006.01)

(52) U.S. Cl.
CPC ...... *G06F 17/5081* (2013.01); *G06F 17/5009* (2013.01)

(58) Field of Classification Search
CPC ............ G06F 17/5081; G06F 17/5068; G06F 2217/12; G06F 17/5072; G06F 2217/78; G06F 2217/82; G06F 17/5009
See application file for complete search history.

(56) References Cited

U.S. PATENT DOCUMENTS

| | | | |
|---|---|---|---|
| 2006/0282249 | A1 | 12/2006 | Ikoma et al. |
| 2009/0288048 | A1* | 11/2009 | Moroz ............... G06F 17/5036 716/136 |
| 2013/0298091 | A1* | 11/2013 | Lee .................... G06F 17/5068 716/102 |
| 2014/0282326 | A1 | 9/2014 | Chen et al. |
| 2015/0143314 | A1 | 5/2015 | Chen et al. |
| 2016/0048622 | A1* | 2/2016 | Jeon ................... G06F 17/5036 703/14 |

FOREIGN PATENT DOCUMENTS

| | | |
|---|---|---|
| DE | 102006059829 A1 | 6/2008 |
| DE | 102013106539 A1 | 9/2014 |
| JP | 2010245382 A | 10/2010 |
| KR | 2006343217 A | 12/2006 |

(Continued)

OTHER PUBLICATIONS

Office Action for the Korean counterpart application 10-2015-0186467 from the Korean Intellectual Property Office dated Nov. 21, 2016.

(Continued)

*Primary Examiner* — Nha Nguyen
(74) *Attorney, Agent, or Firm* — WPAT, P.C., Intellectual Property Attorneys; Anthony King (57) ABSTRACT

A method performed by at least one processor comprises the steps of: generating a layout data of a chip comprising transistors; determining heat-related parameters for the transistors based on the locations thereof in the layout data; generating a netlist data comprising the heat-related parameters; performing a post-layout simulation based on the netlist data; and verifying whether the post-layout simulation meets a design specification.

20 Claims, 7 Drawing Sheets

(56) References Cited

FOREIGN PATENT DOCUMENTS

KR    20140110687 A    9/2014
KR    20150059128 A    5/2015

OTHER PUBLICATIONS

US patent publication No. 20150143314 serving as the English translation for KR20150059128.
US patent publication No. 20060282249 serving as the English translation for JP2006343217.
Office Action for the German counterpart application 10 2015 117 026.4 dated May 9, 2017 from the German Intellectual Property Office.
Knapp, H., "Managing temperature in LTSPICE—Global and local temperatures, temperature dependent components" (URL: https://www.electronicspoint.com/resources/managing-temperature-in-ltspice.18), May 13, 2014.
English abstract translation of DE102006059829.
English abstract of cited reference No. 1 serving as the English translation of cited reference No. 1.
US patent publication No. 20140282326 serving as the English translation of cited reference No. 2.
Notice of Allowance dated Jun. 12, 2017 issued by the Korean Intellectual Property Office for KR application No. 10-2015-0186467.

\* cited by examiner

METHOD OF PARAMETER EXTRACTION AND SYSTEM THEREOF

BACKGROUND

In a design flow for manufacturing semiconductor integrated circuits (IC), various methods and electronic design automation tools are incorporated to set up a desirable simulation environment. A variety of built-in device models and design rules are used to verify the performance of the design, such as the functionality, power, operation time, and die size. In addition, different models with different sets of parameters need to be prepared for addressing different applications. Among the model parameters, a heat-related parameter is utilized to simulate the influence of thermal sources on device functionality and performance. Then, a reasonable design margin is determined and reflected on the design IC by taking into account the thermal effect. Thus, functionality errors or performance degradation due to device heating is minimized in the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
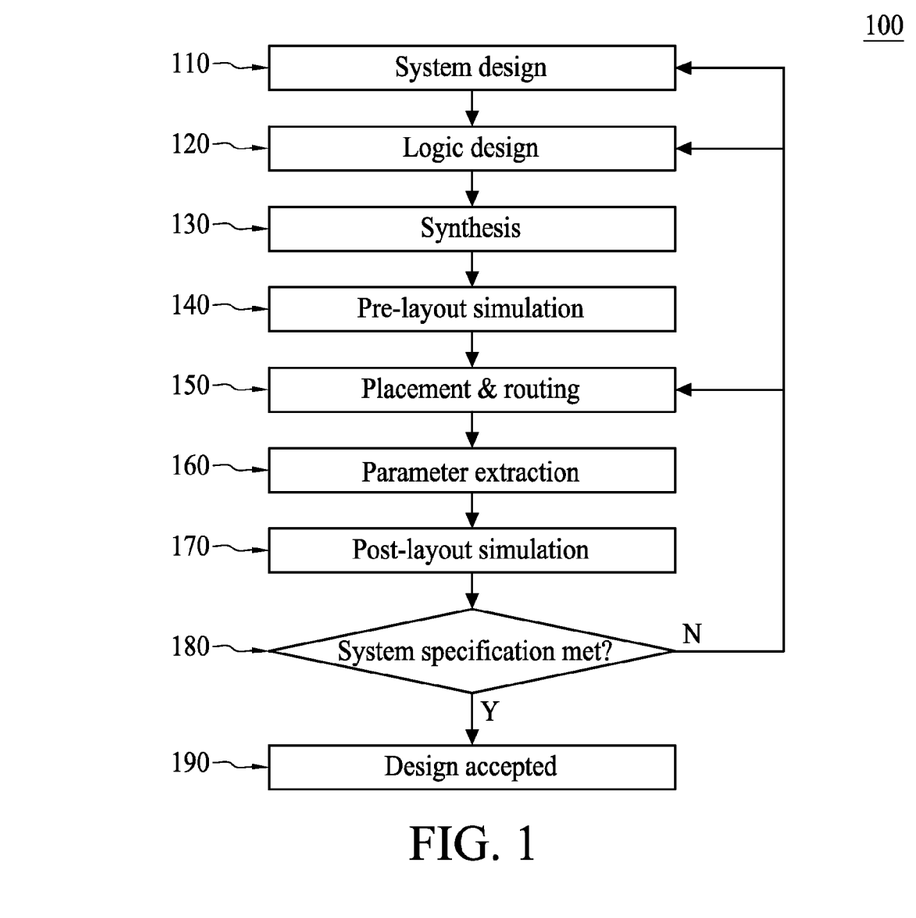
FIG. 1 is a schematic diagram illustrating a design flow in accordance with some embodiments.

FIG. 1 is a schematic diagram illustrating a design flow 100 in accordance with some embodiments. The design flow 100, employed for designing semiconductor chips, utilizes one or more electronic design automation (EDA) tools to perform operations therein. A workstation or personal computer is typically used in executing the tools to accomplish the flow. The design flow 100 comprises a system design stage 110, a logic design stage 120, a synthesis stage 130, a pre-layout simulation stage 140, a layout development stage 150, a parameter extraction stage 160 and a post-layout simulation stage 170.

Initially, at the system design stage 110, a systematic architecture for the chip of interest is provided with a high level description. In that stage, each function of the chip along with performance requirements is determined according to a design specification. Those functions are usually represented by respective schematic functional modules or blocks. In addition, an optimization or performance trade-off may be sought in order to achieve the design specification with affordable cost and power.

At the logic design stage 120, the functional modules or blocks are described in a register transfer level (RTL) using a hardware description language. The language tools are usually available from commercial software, for example, Verilog or VHDL. A preliminary functionality check is performed at the logic design stage 120 to verify if the implemented functions conform to the specification set forth in the system design stage 110.

Subsequently, at the synthesis stage 130, the modules in RTL descriptions are converted into a netlist data where circuit structure, e.g., logic gates and registers, in each function module are established. In some embodiments, technology mapping of such logic gates and registers to available cells in the standard cell libraries are conducted. Further, the netlist data is offered to describe the functional relationship of the chip devices in a gate-level. In an embodiment, the netlist data is transformed from the gate-level view to a transistor-level view.

Then, the gate-level netlist data is verified at the pre-layout simulation stage 140. During the verification process of the stage 140, if some of the functions fail the verification in the simulation, the design flow 100 may be paused temporarily and go back to the stages 110 or 120 for further correction or modification. After the pre-layout simulation stage 140, the IC chip design has passed a preliminary verification and completed the front-end design process. Consequently, a back-end physical design process will follow.

At the layout development stage 150, a physical architecture representing the circuits determined during the front-end process is implemented. The layout development involves a placement operation and a routing operation in series which allow the detailed structure and associated geometry of each component and device to be determined in the placement operation, and interconnects among different components are routed subsequent to the placement operation. Moreover, the placement operation involves deciding where to place each IC chip component and circuitry in a limited amount of space, and the routing operation decides the actual wiring of connecting lines. Both operations of placement and routing are performed to meet a design rule check (DRC) deck, such as from the chip manufacturing facility, so as to fulfill the manufacturing criteria of the chip. After the layout development stage 150, a placed-and-routed layout data is created and a netlist with placement and routing data is generated accordingly.

At the parameter extraction stage 160, a layout parameter extraction (LPE) operation is conducted to derive layout-dependent parameters, such as parasitic resistance and capacitance, resulting from the developed layout. In some embodiments, before the layout parameter extraction operation, a layout-versus-schematic (LVS) verification is performed to check the functional performance of the chip in terms of the placed-and-routed netlist. Consequently, a post-layout netlist data is then generated, which includes the layout-dependent parameters.

At the post-layout simulation stage 170, a physical verification is performed by taking the parameters acquired in previous stages into account. At the stage 170, a simulation of transistor-level behavior is conducted in order to examine whether the chip performs the desired functionality within the required system specification. Moreover, the post-layout simulation is performed to ensure no presence of electrical issues or lithographic issues in the chip manufacturing process.

After the post-layout simulation stage 170, it is determined at a stage 180 whether the post-layout netlist fulfills the design specification. If affirmative, the circuit design is accepted at a stage 190 and then signed off accordingly. However, if the result of the post-layout simulation is unfavorable, the design flow 100 would loop back to previous stages for functionality or performance tuning. For example, the design flow 100 may loop back to the layout development stage 150 where the layout is re-developed so as to fix issues from the layout level. Alternatively, the design flow 100 may retreat to earlier stages; either the system design stage 100 or the logic design stage 120 in order to recast the chip design in case the problems cannot be resolved in the back-end stage.

The design flow 100 illustrated in FIG. 1 is exemplary. Other sequences of the stages or operations, partition of the stages, or additional stages before, between or after the stages shown still fall within the contemplated scope of the present disclosure.

Referring back to the parameter extraction stage 160 of FIG. 1, the layout-dependent parameters extracted based on the layout data determine the effectiveness of the SPICE (Simulation Program with Integrated Circuit Emphasis) models in simulating the chip operation. Among the parameters, heat-related parameters serve to provide information on heat generated from each components of the chip, especially in a transistor-level simulation. A phenomenon called the self-heating effect (SHE) is observed in modeling the heat-generation mechanism. Thus, a better knowledge of the SHE would help derive the heat-related parameters more accurately.

A typical thermal source of SHE for a modeled device in a chip is found to be an active device, such as a Metal-Oxide-Semiconductor Field-Effect Transistor (MOSFET), and specifically, the electrical current flowing through the drain regions thereof. The extent of SHE would be proportional to the level of the operating current or power thereof accordingly. The thermal accumulation due to SHE is regarded more pronounced in advanced semiconductor devices such as a Fin-type FET (FinFET) or a Silicon-on-Insulator FET (SOI FET). Furthermore, another thermal source with respect to the modeled device may be found to be nearby active devices thereof. As a consequence, identification of thermal contributors is critical to SHE modeling. The SHE would thus be better interpreted as a heating effect resulting from both the modeled device itself and nearby devices.

In addition to the thermal sources, the analysis of the SHE reveals that the distances from nearby active devices would determine the actual heat contribution on the modeled device. Further, materials or structures used in connecting nearby devices would also lead to different heat transmission paths. For example, a structure accommodating two adjacent FET devices within a common oxide diffusion (OD) region would allow more heat to distribute between both FET devices than an isolated structure in which two FET devices are disposed in separate OD regions. In other words, the SHE is attributed to the factors including the electrical power level of the modeled device itself, the electrical power levels of nearby devices, the relative distance from such nearby devices or the layout arrangement for the devices. Based on the discussion above, a heat-related parameter would be dependent upon the layout and can be accurately acquired only after the layout is completed.

Also, referring to the post-layout simulation stage 170, a complete post-layout simulation result is obtained by incorporating the SPICE model of each device into the simulator, which analyzes the SHE at different time instances when the thermal sources are powered on or off. The real-time power analysis is accomplished by projecting the switch activity data (i.e., the profile of the device on-off status) during a period of time on the layout data. Therefore, the design flow 100 is operated where a heat-related parameter extraction operation and a dynamic simulator setup are implemented in the stages 160 and 170, respectively. Hence a more accurate simulation result would be obtained.

On the contrary, an SHE modeling in some existing design flows is conducted by assuming a fixed number of thermal sources during the design flow. The nearby active devices sharing a common OD region are counted in the fixed number of thermal sources irrespective of the power values or the relative distances thereof. The static data for the thermal sources is usually determined by means of a lookup table based on the device numbers in each OD region. Additionally, in some existing post-layout simulation methods, the simulator does not take into account the real-time switching status of the thermal sources. Instead, the thermal sources are assumed as being powered on over the simulation period. It is thus found that the resulting simulation result would reflect the actual SHE in terms of neither geometry nor time. Hence, a longer design cycle time may be needed or the manufacturing cost may be increased.

In the following, various embodiments according to the present disclosure would be presented. With reference to the stage 140 of FIG. 1, after a pre-layout simulation operation is completed and has passed the verification, a pre-layout netlist data would be generated to serve as an input for layout development. An exemplary portion extracted from a full pre-layout netlist is demonstrated below where five transistors are involved.

M214 D1 G1 S1 B1 nch_svt
M216 D2 G2 S2 B2 nch_svt
M224 D3 G3 S3 B3 nch_svt
M226 D4 G4 S4 B4 nch_svt
M228 D5 G5 S5 B5 nch_svt Each line of the exemplary netlist data corresponds to each transistor with a similar syntax. The description for each transistor comprises, but is not limited to, a leading entry giving the transistor label (M214 through M228). Then, a four-numbered data and a device model name (nch_svt) follow the transistor label in which the connections of each transistor to other devices through the terminals (drain for D1, gate for G1, source for S1 and body for B1) are identified by the same number. Subsequently, the width identifier L2 and length identifier L1 are provided. A default symbol 'u' is appended to represent the length unit. The exact device geometry and locations corresponding to the exemplary netlist above would be generated in the layout development stage, as illustrated in FIGS. 2A and 2B below.

Figure 2A:
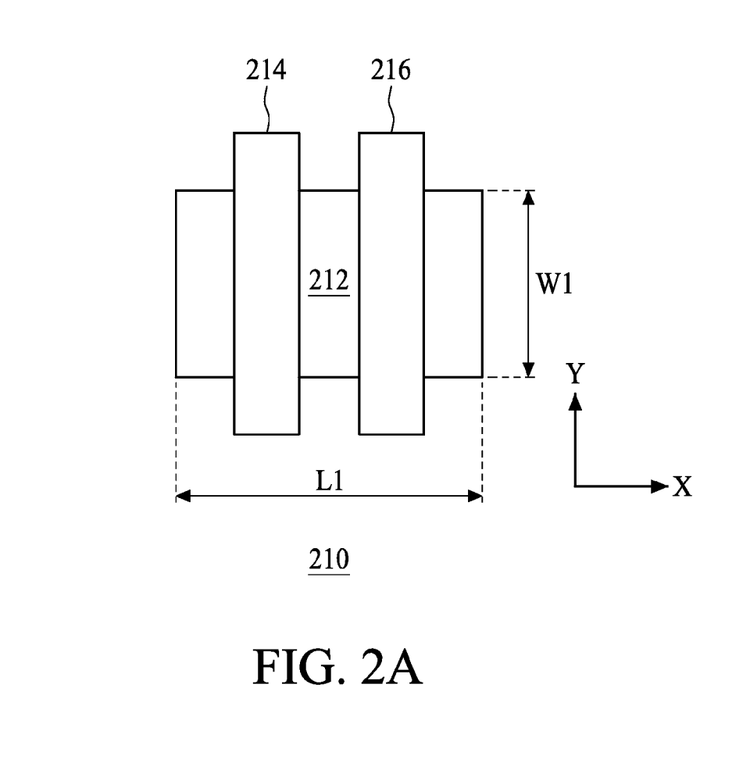
FIGS. 2A and 2B are schematic diagrams of semiconductor devices in accordance with some embodiments.

FIG. 2A is a schematic diagram of a semiconductor device 210 in accordance with some embodiments. The coordinates of the plan follow the coordinate system with arrows pointing in X and Y directions as shown. The semiconductor device 210 may be a FinFET device. In addition, the semiconductor device 210 includes an OD region 212, a first gate region 214 and a second gate region 216 in conformance with the specification set forth in the pre-layout netlist. In the present embodiment, the semiconductor device 210 is generated to implement two transistors of the pre-layout netlist data, such as those named M214 and M216, as discussed above. Similarly, the other three transistors recognized in the netlist data would also be generated in a layout file in the same way.

The OD region 212 shown in two dimensions may correspond to a fin structure of the FinFET device 210. The OD region 212 is generated with an OD length L1 defined along the X direction and an OD width W1 defined along the Y direction. The first gate region 214 and the second gate region 216 correspond to the transistor M214 and the transistor M216, respectively. For convenience, the first gate region 214 and the second gate region 216 represent the first transistor 214 and the second transistor 216, respectively. Moreover, in the layout of the semiconductor device 210, the first gate region 214 and the second gate region 216 are constructed within the OD region 212. This visual information on the device configuration facilitates the subsequent operation of heat-related parameter extraction.

Figure 2B:
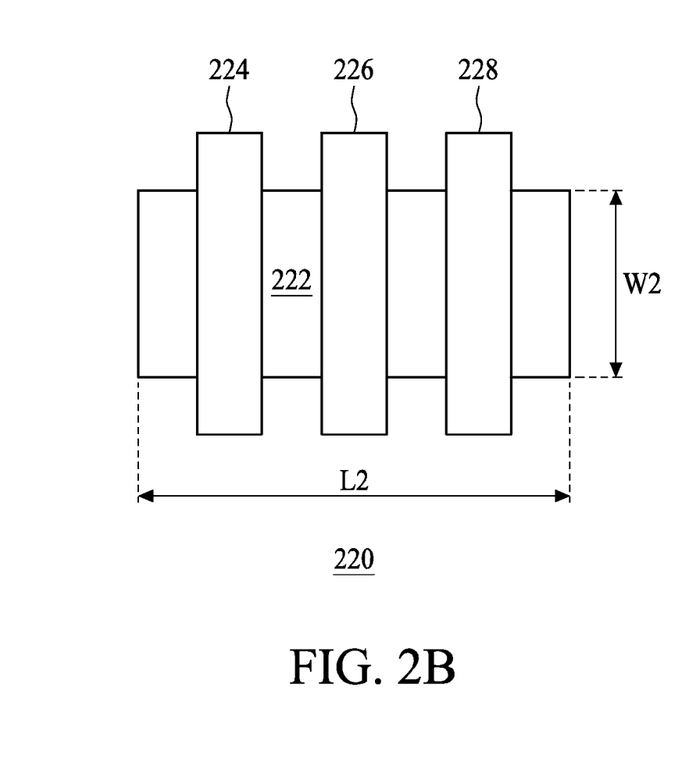

FIG. 2B is a schematic diagram of a semiconductor device 220 in accordance with some embodiments. The semiconductor device 220 includes an OD region 222 with an OD length L2 and an OD width W2. Further, the semiconductor device 220 includes a first gate region 224, a second gate region 226 and a third gate region 228 for implementing the transistors M224, M226 and M228, respectively. The semiconductor device 220 includes a FinFET structure where the three transistor devices are recognized by the respective gate regions.

In some embodiments, the transistors 214, 216, 224, 226 and 228 may be designed with different OD configurations for different applications and constraints. For example, the five transistors may be implemented with five separate OD regions or a single shared OD region. In either case, the implemented chip functionality may be the same as the configuration of two shared OD regions illustrated in FIGS. 2A and 2B. However, the following SHE analysis would be quite different due to the different OD configurations.

The geometry information L1, W1, L2 and W2 of the transistors illustrated in FIGS. 2A and 2B are appended to the original netlist data, as given in another exemplary netlist data below.

Figure 3:
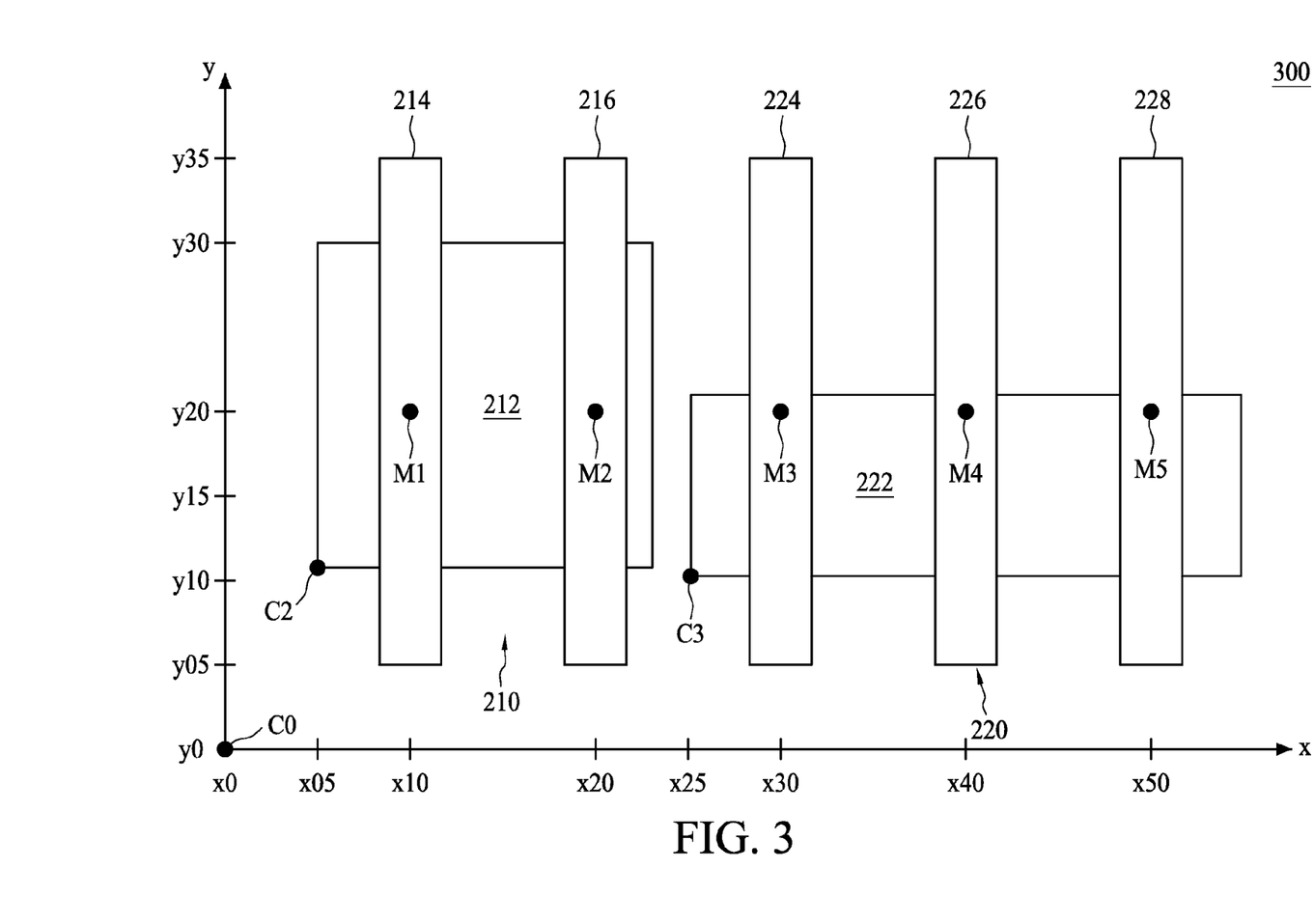
FIG. 3 is a schematic diagram of a layout in accordance with some embodiments.

M214 D1 G1 S1 B1 nch_svt W1=2 u L1=0.5 u
M216 D2 G2 S2 B2 nch_svt W1=2 u L1=0.5 u
M224 D3 G3 S3 B3 nch_svt W2=2 u L2=0.5 u
M226 D4 G4 S4 B4 nch_svt W2=2 u L2=0.5 u
M228 D5 G5 S5 B5 nch_svt W2=2 u L2=0.5 u FIG. 3 is a schematic diagram of a layout data 300 in accordance with some embodiments. The layout data 300 is measured in a rectangular coordinate system with an x axis and a y axis. In addition, an origin identifier C0 is specified in the layout data 300 and used as a reference in the layout data 300. The actual location of the origin identifier C0 can be adjusted. The origin identifier C0 is a global type identifier. The coordinates of a global-type identifier are made fixed in the process of layout development and are not changed with respect to the layout configuration. The layout data 300 includes the semiconductor devices 210 and 220 discussed in FIGS. 2A and 2B, respectively.

The location of the OD region 212 is specified by the location identifier C2 at the lower-left corner. In an embodiment, the location identifier C2 is a global type identifier with respect to the origin identifier C0. For example, the identifier C2 stores the coordinates of (x05, y10). As a result, when the dimensions of the OD region 212 are determined, the boundaries of the OD region 212 can be derived accordingly. Although the location identifier C2 is used for referring to the OD region 212 in the present embodiment, other locations, such as the center or other corners of the OD region 212, can also be specified alternatively.

Then, the locations of the transistors 214 and 216 for the OD region 212 are specified. In an embodiment, the coordinates of the center of the transistor 214 are M1g=(x10, y20). Similarly, the coordinates of the center of the transistor 216 are M2g=(x20, y20). Based on the locations of the transistors 214 and 216, the distance between the transistor 214 and the transistor 216 can be derived. Additionally, the distance between either the transistor 214 or the transistor 216 and other components can also be derived. Although the geometric center is used as the location identifier of the transistors 214 and 216 in the present embodiment, other locations, such as the coordinates of a bottom point (x20, y05) or a top point (x20, y35) for the transistor 214, can be used alternatively. The global location-based information of the transistors is updated and appended to a post-layout netlist data as exemplified below (repeated parameters including terminals, device model name and geometry information are omitted for simplicity).

M214 devx=x10, devy=y20
M216 devx=x20, devy=y20
M224 devx=x30, devy=y20
M226 devx=x40, devy=y20
M228 devx=x50, devy=y20

Subsequently, the layout parameters for describing the transistors 214 and 216 are obtained, which may include the identity of the OD region 212 and the respective locations, and the identity of the OD region 222 and the respective locations. In an embodiment, for the OD region 212, an identity expression ODid=212 is specified for both of the transistors 214 and 216. Likewise, for the OD region 222, an identity expression ODid=222 is specified for the transistors 224, 226 and 228. The information on the shared OD region would facilitate SHE analysis in identifying significant thermal sources for a specific transistor, in addition to the relative distance among the transistors. The location-based parameters and OD region-based parameters of the transistors are shown as exemplified below (the repeated parameters are omitted for simplicity).

M214 devx=x10, devy=y20 ODid=212
M216 devx=x20, devy=y20 ODid=212
M224 devx=x30, devy=y20 ODid=222

M226 devx=x40, devy=y20 ODid=222
M228 devx=x50, devy=y20 ODid=222

In an embodiment, the location information for the identifiers is defined as a relative coordinate. In an embodiment, the locations relative to the identifier C2 of the OD region 212 are recoded with a local representation. For example, the transistor identifier M1 may store the coordinates M1$r$= (x10-x05, y20-y10). Similarly, the transistor identifier M2 may store the coordinates M2$r$=(x20-x05, y20-y10).

The localized location information of the transistors 214 and 216 is updated and appended to a post-layout netlist data as exemplified below (the repeated parameters are omitted for simplicity).

M214 devx=x10-x05, devy=y20-y10 ODid=212
M216 devx=x20-x05, devy=y20-y10 ODid=212

Under the localized setting of the coordinates Mlr and Mgr, the location information on thermal sources for the transistor 214 is limited to those sharing the OD region 212. As a result, the computational burden of a global search for all thermal sources is significantly reduced, especially when a large-scale layout is evaluated over millions of transistors therein. In an embodiment, the local location coordinates of each device can be derived by its global-type identifier in the post-layout simulation stage 170, and vice versa.

In an embodiment, the location information is further simplified as a serial index of a transistor group sharing the common OD region 212. The indexing rule is predetermined, according to which transistors may be indexed from the leftmost or from the rightmost. For example, the transistors 214 and 216 are specified by respective serial numbers 1 and 2 for the OD region 212. Thus, the location information for SHE analysis is further reduced. In the following, an exemplary netlist representing the serial location information is provided.

M214 devid=1 ODid=212
M216 devid=2 ODid=212
M224 devid=1 ODid=222
M226 devid=2 ODid=222
M228 devid=3 ODid=222

An accurate SHE simulation for a specific device requires its location information and its associated OD identity. Referring to the OD regions 212 and 222, although the transistors 214 and 216 may be disposed in a relatively short distance than the transistor 228 with respect to the transistor 224, the SHE impacts may be significantly different since they are arranged in different OD regions. In an existing approach for simulating SHE, only one parameter of the total device count is provided through a predetermined lookup table, which is set as three for the case of the OD region 222. In that case, a logical device number is provided instead of actual device geometric information. In addition, the activity status for all transistors are set as enabled with maximal powers when SHE simulation is conducted. As a consequence, the post-layout simulation using the existing methodology fails to reflect the actual device activities and the associated power distribution. Hence, a pessimistic evaluation result is inevitable and may lead to more iterations of layout tuning.

Figure 4:
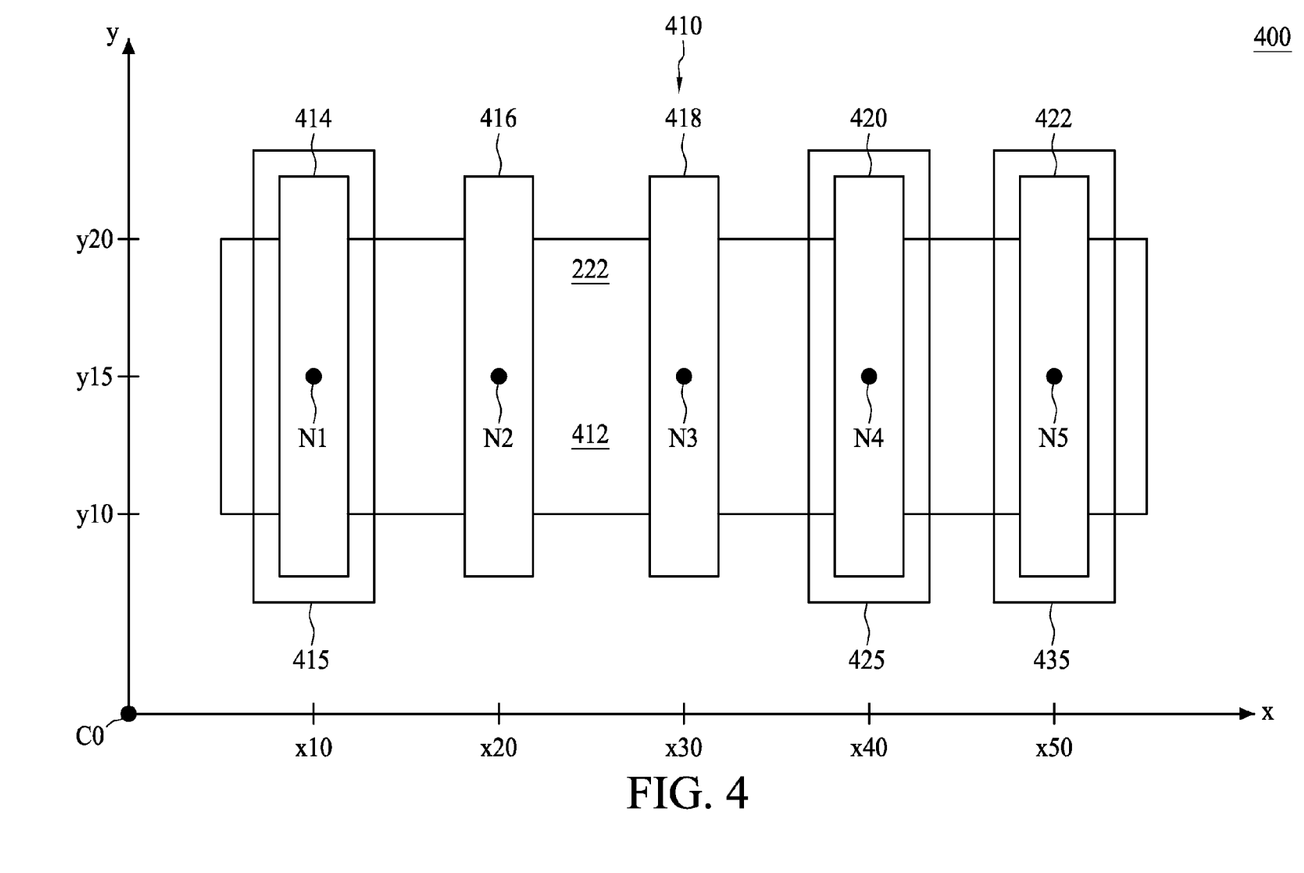
FIG. 4 is a schematic diagram of a layout in accordance with some embodiments.

FIG. 4 is a schematic diagram of a layout data 400 in accordance with some embodiments. The layout data 400 is organized in two overlapped layers with respective components or devices. Since the layout data 400 is shown in it top view in FIG. 4, the two layers may not be visibly separated. In the present embodiment, the layout data 400 includes an exemplary semiconductor device 410 in a first layer. Similar to the description illustrated in FIGS. 2A and 2B, the semiconductor device 410 includes an OD region 412 and five transistor devices 414, 416, 418, 420, and 422. The semiconductor device 410 is defined by an OD region 412 shared by transistors 414, 416, 418, 420, and 422.

In addition, the layout data 400 includes a second layer to serve as a marker layer (not separately shown), in which a first marker region 415, a second marker region 425 and a third marker region 435 are disposed corresponding to the transistors 414, 420, and 422, respectively. Different from the first layer and the associated semiconductor device 410, the first marker region 415, the second marker region 425 and the third marker region 435 together with the marker layer are provided for the purpose of deriving heat-related parameters, and thus would not be included in a post-layout data.

The marker regions 415, 425 and 435 are identified in a separate marker layer of the layout data 400. Moreover, the marker regions 415, 425 and 435 in the layout data 400 are used for labeling significant thermal sources so as to facilitate heat-related parameter extraction. The criteria of determining the marker region may include, but is not limited to, the ranking for levels of operating powers for the transistors, locations of transistors, transistor configuration, requirement of simulation accuracy and system computational resources.

A search distance Ds is defined as a maximal device count of thermal sources for either side of the transistor of interest, assuming the gate regions within an OD region are arranged in parallel. Referring to FIG. 4, the gate regions for the five transistors are disposed in parallel along the Y direction. In the present embodiment, it is assumed that the search distance Ds for the OD region 412 is set as two. That means the search range for significant thermal sources of a transistor, for example 416, would include two nearby devices to the left (transistor 414 alone is counted), two nearby devices to the right (transistors 418 and 420) and the transistor 416 itself. In an embodiment, the search distance Ds is a predetermined value and kept constant during the parameter extraction operation. In another embodiment, the search distance Ds is a function of the chip design constraints and may be varying in different OD regions.

Subsequently, the number Nt of heat-related device for a transistor is determined by counting the number of transistors having a marker layer within the search distance (Ds). Taking transistor 416 as an example, an inspection of FIG. 4 reveals that within the search distance Ds only the transistors 414 and 420 have marker layers. Hence, the heat-related device number Nt is 2, denoted as Nt=2. Similarly, the Nt values are determined as Nt=1, Nt=3, Nt=2 and Nt=2 for transistor 414, 418, 420 and 422, respectively. An exemplary netlist representing the simplified heat-related device number is provided below.

M414 Nt=1
M416 Nt=2
M418 Nt=3
M420 Nt=2
M422 Nt=2

Then, the updated post-layout netlist data is provided and forwarded to the simulation tools. In an existing method, the heat-related parameters are provided while the thermal parameter values of the transistors in a common OD region are determined as equal regardless of the power values and relative locations thereof. In contrast, in the present embodiment, the number of thermal sources are considered fixed and the actual activity status thereof is set as enabled during the chip operation. Consequently, the computational complexity for analyzing the SHE through the parameter Nt is further reduced as compared to coordinate-based thermal parameters such as devx, devy, and ODid. Moreover, although simplified, the parameter Nt is determined by taking into account the device locations and respective power values. Thus, the heat-related parameter Nt is still effective in SHE modeling since the Nt values of nearby transistors sharing a same OD region are different.

The simulation tools may be configured to recognize the marker regions along with respective transistors overlapping thereunder and translate the marker regions into SHE parameters, rather than physical layers in a chip. In the present embodiment, the marker regions are configured in a rectangular shape and disposed to cover the respective transistor on the layout data 400. However, other configurations for the marker regions, for example different shapes of the marker regions or different association approaches with the transistors, are within the contemplated scope of the present disclosure.

Figure 5:
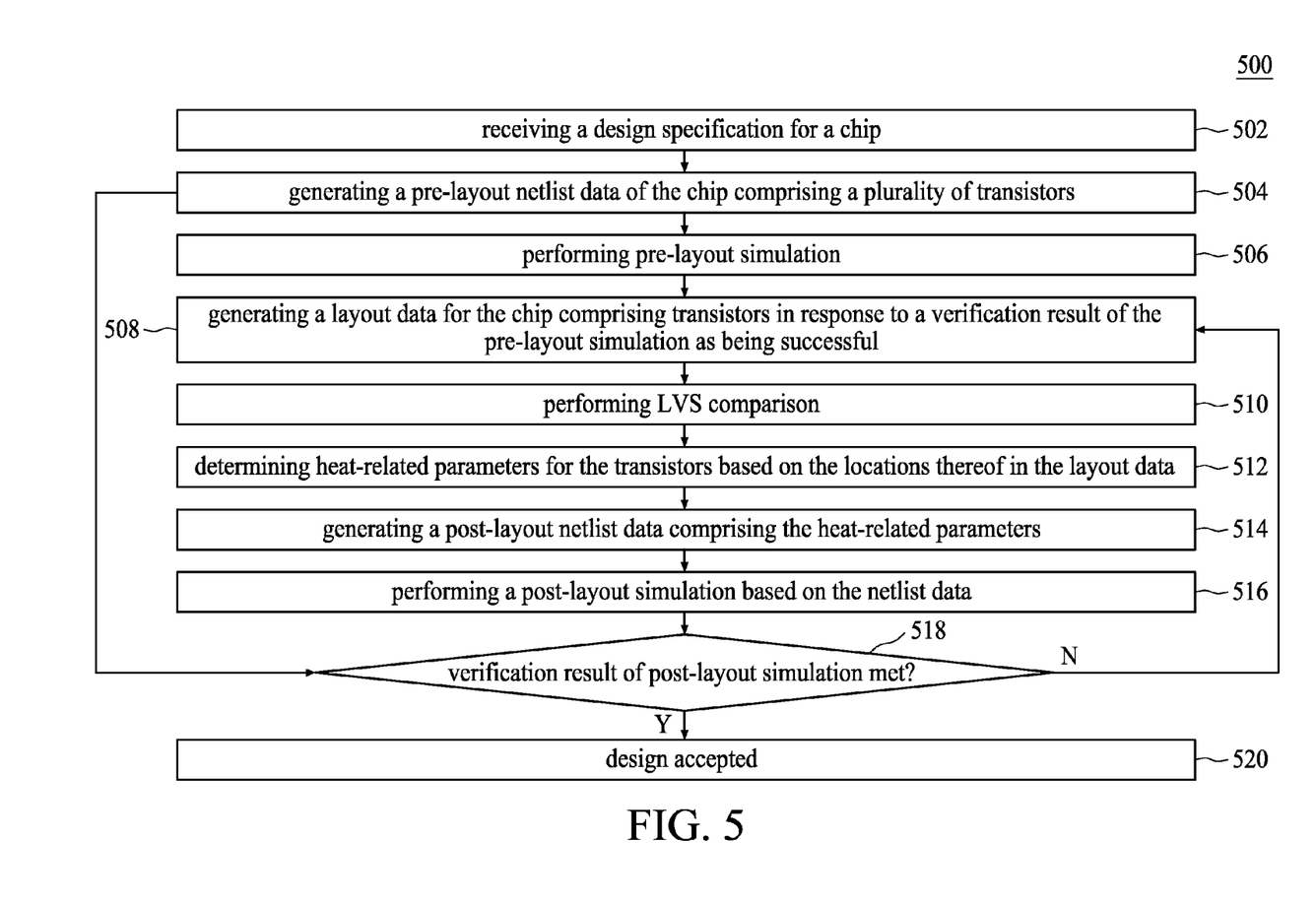
FIG. 5 is a flow diagram of a simulation process in accordance with some embodiments.

FIG. 5 is a flow diagram of a semiconductor design process 500 in accordance with some embodiments.

In an operation 502, a design specification for a chip is received. In the operation 504, a pre-layout netlist data for a chip comprising a plurality of transistors is generated. Then, in an operation 506, a pre-layout simulation is performed to verify whether the pre-layout netlist conforms to the functionality required by the design specification.

In an operation 508, a layout data for the chip comprising the plurality of transistors is generated in response to a verification result of the pre-layout simulation as being successful. The layout data is generated through placement of devices, such as transistors, OD regions, and other devices. Further, a routing operation is conducted to provide interconnections among devices.

Subsequently, the design process proceeds with LVS comparison in an operation 510 where a post-layout schematic is compared against the pre-layout netlist data in order to ensure that the resulting layout data conforms to a design rule.

In an operation 512, heat-related parameters for the transistors are determined based on location information thereof in the layout data. The heat-related parameters are determined based on power levels of the transistors, the locations of the transistors or whether the transistors share a common OD region.

In an embodiment, the layout data comprises an OD region shared by the transistors, and the heat-related parameter comprises a grouping identifier, based on the OD region, and serial numbers corresponding to respective transistors. In an embodiment, the heat-related parameter comprises a coordinate. The coordinate may be of a global type relative to a reference coordinate in the layout data, or of localized type relative to the OD region.

In an embodiment, the layout data further comprises a marker layer on which a marker region is generated corresponding to one of the transistors. For example, the marker region is generated based on a ranking for the power levels or locations of the transistors. Moreover, a heat-related device number is determined based on the marker region and a search distance. Further, the heat-related parameters are determined based on whether the transistors share a common OD region.

In an operation 514, a post-layout netlist data comprising the heat-related parameters is generated. Then, a post-layout simulation is performed using the consolidated netlist data in an operation 516. In an embodiment, the post-layout simulation is performed based on instant power levels and heat-related parameters of the transistors.

In an operation 518, it is determined whether the verification result against the pre-layout netlist data meets the design specification. If the result is affirmative, the circuit design is accepted in an operation 520 and the design is signed off. On the contrary, if the simulation result fails the design specification, the design loops back to the operation 508 for redeveloping the layout data, or the operation 504 to refine the pre-layout netlist data.

Figure 6:
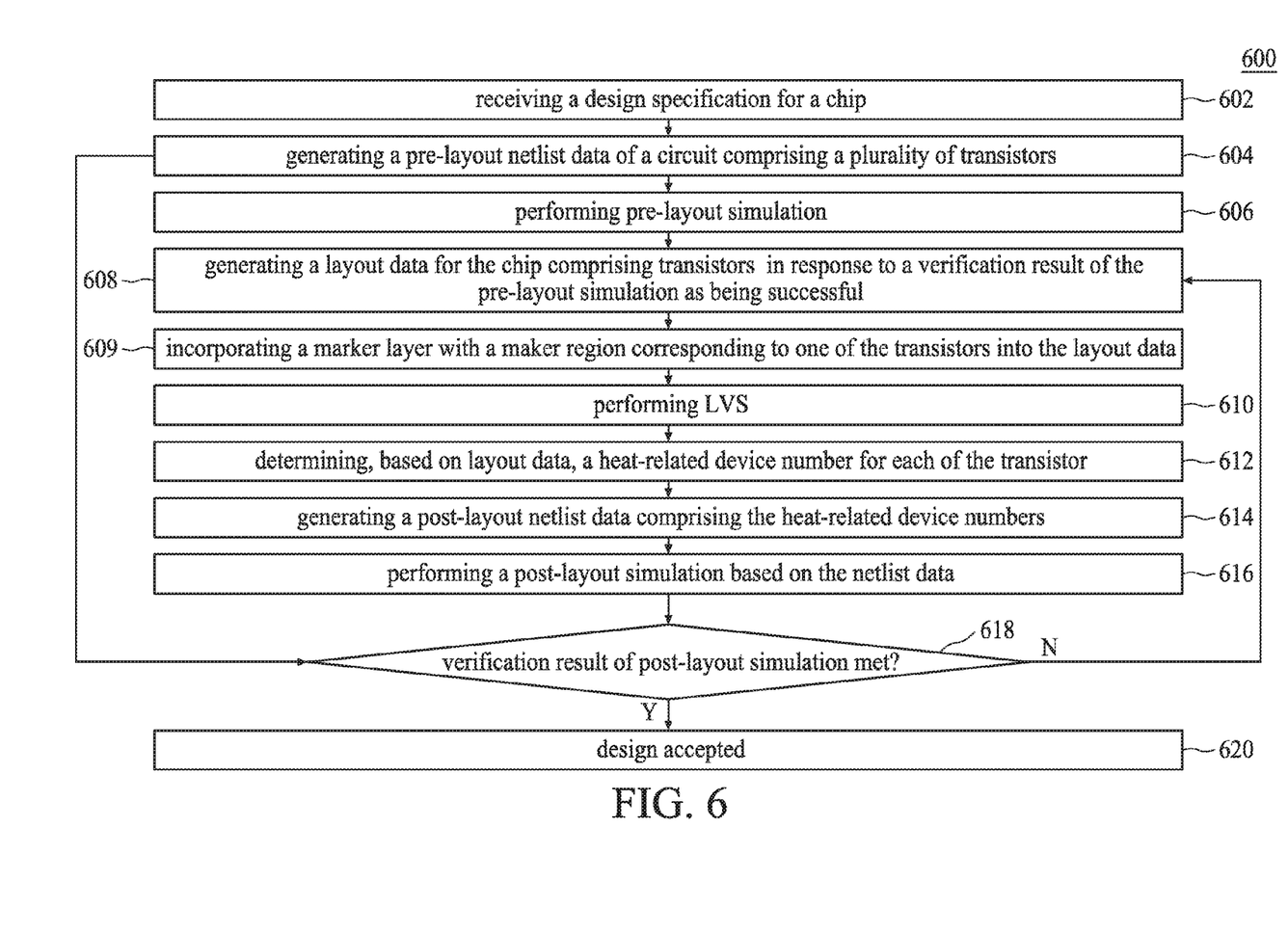
FIG. 6 is a flow diagram of a simulation process in accordance with some embodiments.

FIG. 6 is a flow diagram of a semiconductor design process 600 in accordance with some embodiments. Operations 602-608 shown in FIG. 6 follow similar steps in operations 502-508 illustrated in FIG. 5, and thus, the details are omitted for simplicity.

Subsequently, a marker layer with a maker region corresponding to one of the transistors is incorporated into the layout data, in an operation 609, in response to a verification result of the pre-layout simulation as being successful. The marker layers are generated so as to identify the transistors as significant thermal sources. In an embodiment, the marker region is generated based on a ranking for the power levels or locations of the transistors.

Then, in an operation 610, an LVS comparison process is performed, similar to the operation 510 illustrated in FIG. 5.

Then, a heat-related device number for each of the transistors is determined based on layout data in an operation 612. The heat-related parameters are generated based on the grouping parameters and the neighbor distance. In an embodiment, the heat-related device number is determined based on the marker region and a search distance.

Then, in an operation 614, a post-layout netlist data comprising the heat-related device numbers is generated. Subsequently, operations 616-620 are performed similarly to operations 516-520 illustrated in FIG. 5.

Figure 7:
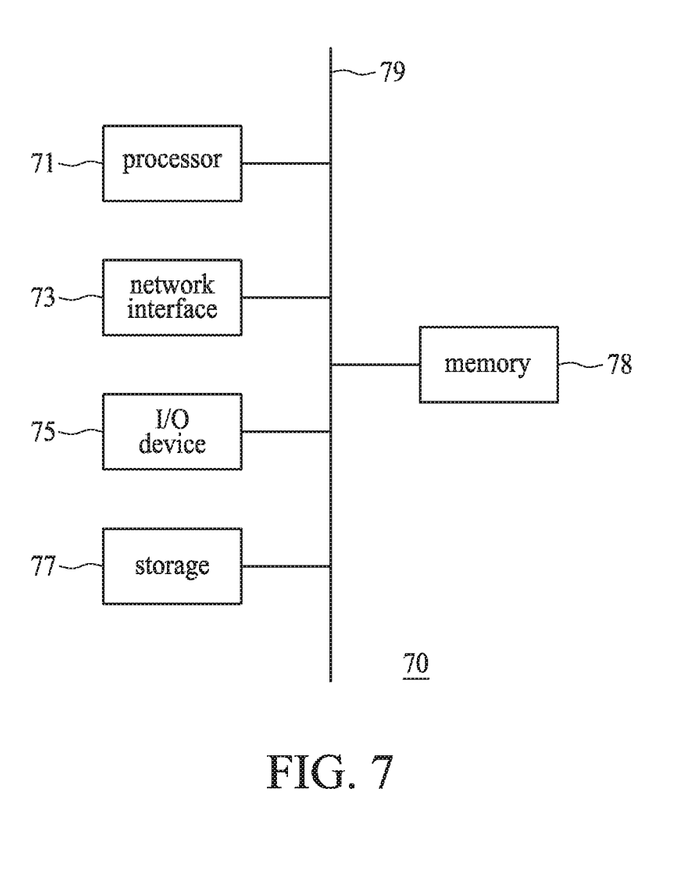
FIG. 7 is a block diagram of a hardware system in accordance with some embodiments.

FIG. 7 is a block diagram of a system 70 for placement and routing in accordance with some embodiments. Referring to FIG. 7, a system 70 includes a processor 71, a network interface 73, an input and output (I/O) device 75, a storage 77, a memory 78, and a bus 79. The bus 79 couples the network interface 73, the I/O device 75, the storage 77 and the memory 78 to the processor 71.

The processor 71 is configured to execute program instructions that include a tool configured to perform the method as described and illustrated with reference to FIG. 1. Moreover, the tool is configured to perform the method for wire routing as described and illustrated with reference to FIGS. 6 and 7. Accordingly, the tool is configured to execute the steps such as: provide design specification, generate a netlist of a circuit, perform pre-layout simulation, generate a layout, perform LVS, generate group parameters, location-based parameters or heat-related parameters of a plurality of transistors, generate a consolidated netlist by incorporating the parameters, perform post-layout simulation and verify the post-layout simulation result.

The network interface 73 is configured to access program instructions and data accessed by the program instructions stored remotely through a network (not shown).

The I/O device 75 includes an input device and an output device configured for enabling user interaction with the system 70. In some embodiments, the input device comprises, for example, a keyboard, a mouse, and other devices. Moreover, the output device comprises, for example, a display, a printer, and other devices.

The storage device 77 is configured for storing program instructions and data accessed by the program instructions. In some embodiments, the storage device 77 comprises, for example, a magnetic disk and an optical disk.

The memory 78 is configured to store program instructions to be executed by the processor 71 and data accessed by the program instructions. In some embodiments, the memory 78 comprises a random access memory (RAM) and/or some other volatile storage device and/or read only memory (ROM) and/or some other non-volatile storage device.

In some embodiments, a method performed by at least one processor is provided. In the method, a layout data of a chip comprising transistors is provided by the at least one processor. Heat-related parameters for the transistors are determined based on the locations thereof in the layout data. A netlist data comprising the heat-related parameters is generated by the at least one processor. A post-layout simulation is generated based on the netlist data by the at least one processor. Further, the method verifies whether the post-layout simulation meets a design specification.

In some embodiments, a method performed by at least one processor is provided. A layout data of a chip comprising transistors is generated by the at least one processor. A marker layer is incorporated, with a maker region corresponding to one of the transistors, into the layout data by the at least one processor. Based on the layout data, a heat-related device number for each of the transistors is determined by the at least one processor. A netlist data comprising the heat-related parameters is generated by the at least one processor. A post-layout simulation is performed based on the netlist data by the at least one processor, and it is verified whether the post-layout simulation meets a design specification.

In some embodiments, a system is provided which comprises one or more processors and one or more programs including instructions. The instructions, when executed by the one or more processors, cause the system to: generate a layout data of a chip comprising transistors by the at least one processor; determine, based on the layout data, heat-related parameters for the transistors by the at least one processor; generate a netlist data comprising the heat-related parameters by the at least one processor; perform a post-layout simulation based on the netlist data by the at least one processor; and verify whether the post-layout simulation meets a design specification.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, performed by at least one processor, comprising:
    generating a layout data of a chip comprising transistors;
    determining heat-related parameters for the transistors based on locations of the transistors in the layout data;
    generating a netlist data comprising the heat-related parameters;
    performing a post-layout simulation based on the netlist data and a time-varying on-off status profile of the transistors;
    verifying whether the post-layout simulation meets a design specification; and
    manufacturing the chip using the netlist in response to the post-layout simulation being verified as meeting the design specification.

2. The method according to claim 1, wherein the step of performing the post-layout simulation comprises performing the post-layout simulation based on instant power levels and heat-related parameters of the transistors.

3. The method according to claim 1, wherein the step of determining the heat-related parameters comprises determining the heat-related parameters based on power levels of the transistors, the locations of the transistors or whether the transistors share a common oxide diffusion (OD) region.

4. The method according to claim 1, wherein the layout data comprises an oxide diffusion (OD) region shared by the transistors, and the heat-related parameters comprise a grouping identifier, based on the OD region, and serial numbers corresponding to respective transistors.

5. The method according to claim 1, wherein the heat-related parameter comprises a coordinate.

6. The method according to claim 5, wherein the coordinate is of a global type relative to a reference coordinate in the layout data.

7. The method according to claim 5, wherein the layout data further comprises an oxide diffusion (OD) region, the method further comprising a grouping identifier for the transistors based on the layout data.

8. The method according to claim 7, wherein the coordinate is of a localized type relative to the oxide diffusion (OD) region.

9. The method according to claim 1, wherein the step of generating the layout data further comprises generating a marker region on a marker layer of the layout data corresponding to one of the transistors.

10. The method according to claim 9, wherein the marker region is generated based on a ranking for the power levels or locations of the transistors.

11. The method according to claim 9, wherein the step of determining the heat-related parameters comprises determining a heat-related device number based on the marker region and a search distance.

12. The method according to claim 11, wherein the layout data comprises an oxide diffusion (OD) region, and the heat-related parameters are further determined based on whether the transistors share the OD region.

13. A system, comprising one or more processors and one or more programs including instructions which, when executed by the one or more processors, cause the system to:
    generate a layout data of a chip comprising transistors;
    determine, based on the layout data, heat-related parameters for the transistors;
    generate a netlist data comprising the heat-related parameters;
    perform a post-layout simulation based on the netlist data and a time-varying on-off status profile of the transistors;
    verify whether the post-layout simulation meets a design specification; and
    manufacturing the chip using the netlist in response to the post-layout simulation being verified as meeting the design specification.

14. The system according to claim 13, wherein the step of determining the heat-related parameters comprises determining the heat-related parameters based on power levels of the transistors, locations of the transistors or whether the transistors share a common oxide diffusion (OD) region.

15. The system according to claim 13, wherein the heat-related parameter comprises a coordinate.

16. The system according to claim 15, wherein the coordinate is of a global type relative to a reference coordinate in the layout data.

17. A method, performed by at least one processor, comprising:
 generating a layout data of a chip comprising transistors;
 determining a first parameter corresponding to one of the transistors based upon power levels of the transistors and upon at least one distance between the one of the transistor and the remainder of the transistors;
 generating a post-layout netlist data comprising the first parameter;
 performing a post-layout simulation based on the netlist data and a transistor switch activity data; and
 manufacturing the chip using the netlist in response to the post-layout simulation being verified as meeting a design specification.

18. The method according to claim 17, further comprising, prior to the determining a parameter corresponding to one of the transistor:
 generating a pre-layout netlist data of the chip comprising the transistors; and
 performing a pre-layout simulation based on the pre-layout netlist data.

19. The method according to claim 17, wherein the performing a post-layout simulation based on the netlist data further comprising performing the post-layout simulation based on power levels of the transistor at different time instances during the post-layout simulation.

20. The method according to claim 17, further comprising determining a second parameter corresponding to the one of the transistors based upon whether the transistors share a same oxide diffusion (OD) region.

* * * * *